(12) United States Patent
Bi (10) Patent No.: US 12,317,680 B2
(45) Date of Patent: May 27, 2025

(54) MASK, MANUFACTURING METHOD THEREOF AND MASK ASSEMBLY

(71) Applicant: BOE Technology Group Co., Ltd., Beijing (CN)

(72) Inventor: Na Bi, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 698 days.

(21) Appl. No.: 17/608,159

(22) PCT Filed: Jan. 28, 2021

(86) PCT No.: PCT/CN2021/074045
§ 371 (c)(1),
(2) Date: Nov. 2, 2021

(87) PCT Pub. No.: WO2022/160146
PCT Pub. Date: Aug. 4, 2022

(65) Prior Publication Data
US 2023/0255055 A1    Aug. 10, 2023

(51) Int. Cl.
*H10K 59/12* (2023.01)
*G03F 1/68* (2012.01)
*G03F 7/00* (2006.01)
*H10K 71/16* (2023.01)

(52) U.S. Cl.
CPC .......... *H10K 59/1201* (2023.02); *G03F 1/68* (2013.01); *G03F 7/0007* (2013.01); *H10K 71/166* (2023.02)

(58) Field of Classification Search
USPC .......................................... 118/504, 505, 721
See application file for complete search history.

(56) References Cited

U.S. PATENT DOCUMENTS

| | | | |
|---|---|---|---|
| 2014/0331925 | A1 | 11/2014 | Han |
| 2015/0007768 | A1 | 1/2015 | Lee |
| 2016/0322571 | A1 | 11/2016 | Lee et al. |
| 2019/0326514 | A1 | 10/2019 | Liu et al. |
| 2021/0066600 | A1 | 3/2021 | Du et al. |
| 2022/0131074 | A1* | 4/2022 | Bai .................... C23C 14/12 |

FOREIGN PATENT DOCUMENTS

| | | |
|---|---|---|
| CN | 104141106 A | 11/2014 |
| CN | 108179380 A | 6/2018 |
| CN | 108611592 A | 10/2018 |

(Continued)

OTHER PUBLICATIONS

English Translation CN110359010 (Year: 2019).*
English Translation KR-20200011294 (Year: 2020).*

*Primary Examiner* — Yewebdar T Tadesse
(74) *Attorney, Agent, or Firm* — Ling Wu; Stephen Yang; Ling and Yang Intellectual Property (57) ABSTRACT

A mask, a manufacturing method thereof and a mask assembly are provided. The mask includes a display region and welding regions located on opposite sides of the display region in a first direction, wherein the welding region at least includes a thickened portion, and a set welding region is disposed on the thickened portion; a thickness of the set welding region is greater than that of the display region; and in a horizontal direction of the display region, the thickened portion protrudes from a surface of at least one side of the display region.

15 Claims, 6 Drawing Sheets

(56) References Cited

FOREIGN PATENT DOCUMENTS

| | | | | |
|---|---|---|---|---|
| CN | 108642441 | A | | 10/2018 |
| CN | 108914057 | A | | 11/2018 |
| CN | 208266252 | U | | 12/2018 |
| CN | 208604193 | U | | 3/2019 |
| CN | 109913805 | A | | 6/2019 |
| CN | 110284101 | A | | 9/2019 |
| CN | 110359010 | A | * | 10/2019 ........... C23C 14/042 |
| CN | 110423983 | A | | 11/2019 |
| CN | 111172495 | A | | 5/2020 |
| CN | 111206215 | A | | 5/2020 |
| CN | 210534534 | U | | 5/2020 |
| CN | 112267092 | A | | 1/2021 |
| KR | 20200011294 | A | * | 2/2020 |

* cited by examiner

MASK, MANUFACTURING METHOD THEREOF AND MASK ASSEMBLY

CROSS-REFERENCE TO RELATED APPLICATION

The present application is a U.S. National Phase Entry of International Application PCT/CN2021/074045 having an international filing date of Jan. 28, 2021 and entitled "Mask, Manufacturing Method Thereof and Mask Assembly", the contents of which should be construed as being hereby incorporated by reference in their entirety.

TECHNICAL FIELD

The present disclosure relates to, but is not limited to, the technical field of display, in particular to a mask and a manufacturing method thereof, and a mask assembly.

BACKGROUND

In a manufacturing process of a display panel, a fine metal mask plays an important role, especially in a manufacturing process of an OLED display panel, which directly determines whether an organic light-light-emitting material can be accurately deposited on a corresponding OLED substrate.

In a process of pixel formation, red, green and blue light-emitting materials are deposited on corresponding positions of the substrate by using a Fine Metal Mask (FMM). Wet etching is adopted in a traditional manufacturing process of a metal mask to form pixel openings on a metal sheet. However, due to an isotropic characteristic of the wet etching, it is difficult to accurately control a width of a pixel opening, and because of the limitation of the thickness of the thin metal plate, it is difficult to make a metal mask with high resolution by this method.

A Quarter High Definition (QHD) image quality is 500 to 600 pixels per inch (PPI), and a pixel size is about 30 to 50 For resolutions such as Ultra High Definition (UHD) levels or higher, the pixel size is smaller. The thicker the fine metal mask, the harder it is to achieve high resolution.

An Electroforming Mask (EFM) is made by using an electroplating process to deposit a thin metal film on a metal electrode and form a pixel pattern on the coated film. Compared with the current etching method, the fine metal mask prepared by electroforming may be made thinner, and a UHD (Ultra High Definition) resolution (3840×2160) may be achieved.

Since the fine metal mask formed by electroforming is too thin—with a thickness of only several micrometers to tens of micrometers, during laser welding to a metal frame, a case of burn through in welding of the metal frame of the fine metal mask and yield rate is decreased.

SUMMARY

The following is a summary of the subject matters described in the present disclosure in detail. The summary is not intended to limit the scope of protection of the claims.

A mask includes a display region and welding regions located on opposite sides of the display region in a first direction, wherein each welding region at least includes a thickened portion, and a set welding region is disposed on the thickened portion; a thickness of the set welding region is greater than a thickness of the display region; and in a horizontal direction of the display region, the thickened portion protrudes from a surface of at least one side of the display region.

In an exemplary embodiment, in the horizontal direction of the display region, a part of the thickened portion protruding from the surface of the display region includes a first welding surface parallel to the surface of the display region and a second welding surface connected to a side of the first welding surface close to the display region, and the second welding surface includes multiple convex portions and concave portions disposed at intervals.

In an exemplary embodiment, the convex portions and/or the concave portions are pointed, semi-circular arc or U-shaped.

In an exemplary embodiment, an internal angle formed between the second welding surface and the surface of the display region is greater than 90 degrees and less than 180 degrees.

In an exemplary embodiment, an area of the set welding region is 10-50 times that of a welding spot required for welding in the welding region.

In an exemplary embodiment, the set welding regions are disposed along a second direction of the thickened portion to form a set welding region column, and the set welding regions in adjacent set welding region columns are disposed in a staggered manner, and the first direction is different from the second direction.

In an exemplary embodiment, first anti-wrinkling openings are formed between adjacent set welding regions in the set welding region column.

In an exemplary embodiment, curvature of an edge of a first anti-wrinkling opening close to a set welding region is same as curvature of an edge of the set welding region close to the first anti-wrinkling opening.

In an exemplary embodiment, the display region includes a pixel opening region and a transition region, wherein the transition region is located at one side of the pixel opening region close to the welding region, and the transition region is provided with second anti-wrinkling openings.

In an exemplary embodiment, the pixel opening region is provided with pixel openings, and the second anti-wrinkling openings are the same as the pixel openings.

In an exemplary embodiment, the thickened portion is provided with third anti-wrinkling openings and the third anti-wrinkling openings are located at one side of the thickened portion close to the display region.

In an exemplary embodiment, the thickened portion is provided with multiple third anti-wrinkling openings, and the third anti-wrinkling openings are disposed along the first direction of the display region to form a third anti-wrinkling opening row.

In an exemplary embodiment, sizes of the third anti-wrinkling openings in the third anti-wrinkling opening row gradually decrease along a direction approaching the display region; and/or distances between adjacent third anti-wrinkling openings in the third anti-wrinkling opening row gradually decrease along the direction approaching the display region.

In an exemplary embodiment, the thickened portion is provided with multiple third anti-wrinkling openings, and sizes of the third anti-wrinkling openings gradually decrease along a direction approaching the display region; and/or distances between adjacent third anti-wrinkling openings gradually decrease along the direction approaching the display region.

In an exemplary embodiment, in a thickness direction of the thickened portion, the thickened portion includes a first electroforming layer and a second electroforming layer which are stacked, and the second electroforming layer at least partially protrudes from the display region.

In an exemplary embodiment, a thickness of the first electroforming layer is 5 to 30 μm, and a thickness of the second electroforming layer is 2 to 30 μm.

A mask assembly includes a frame and the mask mentioned above, wherein a welding region of the mask is connected to the frame by welding.

A method for manufacturing a mask, including the following steps:

forming a display region, and welding regions on two opposite sides of the display region in a first direction, wherein each welding region at least includes thickened portions, and a set welding region is disposed on the thickened portion; a thickness of the set welding region is greater than a thickness of the display region; and in a horizontal direction of the display region, the thickened portion protrudes from a surface of at least one side of the display region.

Other aspects may be comprehended upon reading and understanding of the drawings and the detailed descriptions.

BRIEF DESCRIPTION OF DRAWINGS

The attached drawings are for providing a further understanding of technical solutions of the present disclosure and constitute a part of the description. They are for explaining the technical solutions of the present disclosure together with the embodiments of the present disclosure and do not constitute a limitation on the technical solutions of the present disclosure. Shapes and sizes of various components in the drawings do not reflect true scales and are only intended to illustrate contents of the present disclosure schematically.

DETAILED DESCRIPTION

The embodiments herein may be implemented in multiple different forms. A person of ordinary skills in the art may readily understand a fact that implementation modes and contents may be transformed into a variety of forms without departing from the essence and scope of the present disclosure. Therefore, the present disclosure should not be construed as being limited only to the contents described in the following embodiments. The embodiments and features in the embodiments in the present disclosure may be combined randomly if there is no conflict.

In the drawings, a size of a constituent element, a thickness of a layer or an area of the layer may be sometimes exaggerated for clarity. Therefore, any implementation mode of the present disclosure is not necessarily limited to sizes shown in the drawings, and the shapes and sizes of components in the drawings do not reflect true scales. In addition, the drawings schematically show ideal examples, and any implementation mode of the present disclosure is not limited to the shapes or values shown in the drawings.

In the present disclosure, ordinal numbers such as "first", "second", and "third" are set to avoid confusion between constituent elements, rather than to limit in quantity.

In the present disclosure, for sake of convenience, wordings indicating orientations or positional relations such as "central", "upper", "lower", "front", "rear", "vertical", "horizontal", "top", "bottom", "inner", "outer" are used to describe positional relations between constituent elements with reference to the drawings, which are only for convenience of describing the embodiments and simplifying the description, rather than indicating or implying that the device or element referred to must have a specific orientation, or must be constructed and operated in a specific orientation, and therefore cannot be construed as limitations on the present disclosure. The positional relations between the constituent elements may be appropriately changed according to a direction in which each constituent element is described. Therefore, it is not limited to the wordings described in the present disclosure, and may be changed appropriately according to situations.

In the present disclosure, the terms "install", "connect", and "couple" shall be understood broadly unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art may understand meanings of the above terms in the present disclosure according to situations.

In the present disclosure, "parallel" refers to a state in which an angle formed by two straight lines is above −10 degrees and below 10 degrees, and thus also includes a state in which the angle is above −5 degrees and below 5 degrees. In addition, "vertical" refers to a state in which an angle formed by two straight lines is above 80 degrees and below 100 degrees, and thus also includes a state in which the angle is above 85 degrees and below 95 degrees.

The wording "about" in the present disclosure means that a limit is not strictly limited, and a value within a range of process and measurement errors is allowed.

Figure 1:
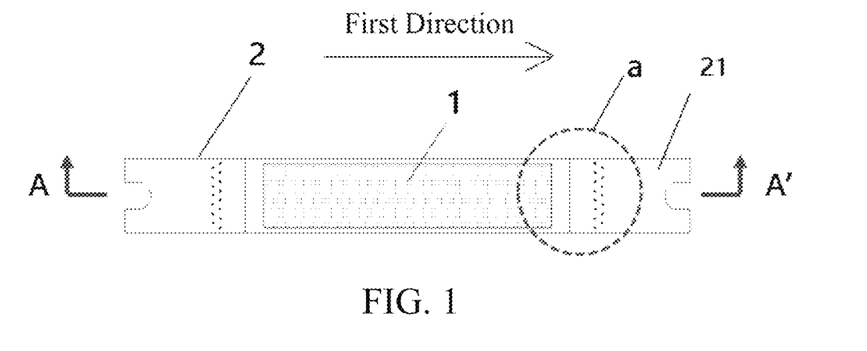
FIG. 1 is a schematic diagram of a structure of a mask according to an exemplary embodiment of the present disclosure.
Figure 2:
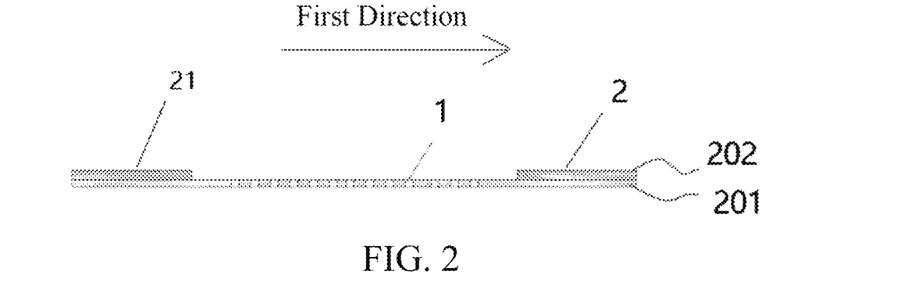
FIG. 2 is a sectional view taken along A-A' direction in FIG. 1.
Figure 3:
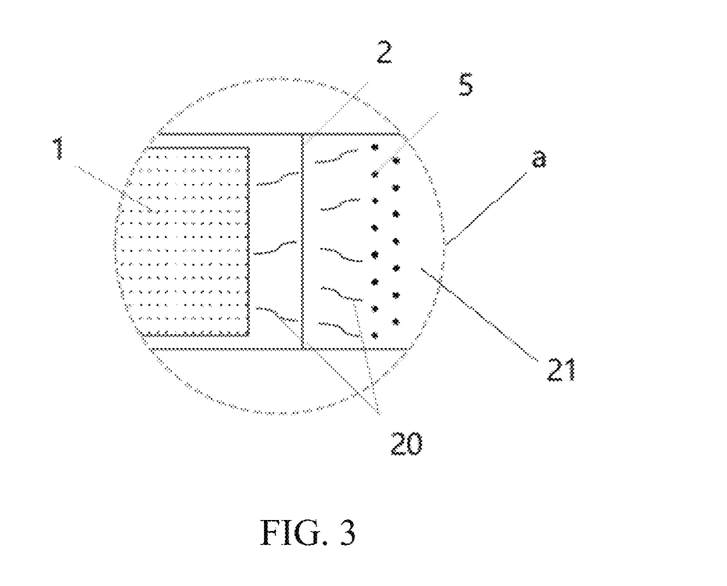
FIG. 3 is an enlarged view of a in FIG. 1.

FIG. 1 is a schematic diagram of a structure of a mask according to an exemplary embodiment of the present disclosure. FIG. 2 is a sectional view taken along an A-A' direction in FIG. 1. FIG. 3 is an enlarged view of a in FIG. 1. As shown in FIG. 1, FIG. 2 and FIG. 3, the mask of the embodiment of the present disclosure includes a display region 1 and welding regions 2 located on opposite sides of the display region 1 in a first direction. Each welding region 2 at least includes a thickened portion 21, wherein the thickened portion 21 is provided with a set welding region 5, and a thickness of the set welding region 5 is greater than that of the display region 1. In a horizontal direction of the display region 1, the thickened portion 21 protrudes from a surface of at least one side of the display region 1, that is, in a thickness direction of the display region 1, a surface of at least one side of the thickened portion 21 is higher than a surface of at least one side of the display region 1, and a surface of at least one side of the thickened portion 21 is located on a same side as a surface of at least one side of the display region 1. Herein, the first direction may be a length direction of the display region. The set welding region 5 is a region where the welding region 2 is welded to a frame, and the set welding region 5 is a reserved area near a welding spot, and there is no opening in the set welding region 5. During the welding, a part of the welding region 5 is melted and adheres to the frame. According to the welding precision and welding spot size parameters of a welding device, an area of the set welding region 5 is preset.

In the present disclosure, the melted part of the set welding region is approximately circular, and a boundary of the welding region is set to be approximately circular, but not limited to circular, and other shapes, for example, regular or irregular shapes such as rectangle and rhombus, may also be used.

The mask in the present disclosure is a mask used in an evaporation process of organic light-emitting materials, and the display region 1 is provided with multiple pixel openings. In a process of preparing an OLED display panel, the display region 1 is used for evaporation of organic light-emitting materials to form red (R), green (G) and blue (B) pixels of the OLED display panel. In a process of evaporation of organic light-emitting materials, in order to make the mask and an OLED substrate completely attached to each other and make the organic light-emitting materials accurately evaporate at a corresponding position on the OLED substrate, it is necessary to carry out a netting process on the mask, so that the mask may be stretched and then welded to a frame to be assembled into a mask assembly.

According to the research of the inventor, a thickness of an electroforming mask (EFM) is too small, which is only several microns to tens of microns. In a process of stretching and then welding the mask to the frame, a case of burn through in welding of the frame may easily occur, which decreases the yield rate.

In view of this, in the present disclosure, the welding region 2 is thickened to form a thickened portion 21, and the set welding region 5 is disposed on the thickened portion 21, so that the thickness of the set welding region is greater than that of the display region 1, thus avoiding the welding region 2 from being too thin, which causes burn through in welding of the frame, thereby improving the yield rate and enhancing welding firmness of the welding region 2 while ensuring that the thickness of the display region 1 remains unchanged.

In an exemplary embodiment, the welding region may entirely or partially be the thickened portion. When the welding region is a thickened portion, the thickened portion may be located at a side of the welding region close to the display region.

As shown in FIGS. 1, 2 and 3, in a thickness direction of the thickened portion 21, the thickened portion 21 includes a first electroforming layer 201 and a second electroforming layer 202 which are stacked. In a horizontal direction of the display region 1, the second electroforming layer 202 at least partially protrudes from a surface on a side of the display region 1. The second electroforming layer 202 is provided with a set welding region 5. According to the embodiment of the present disclosure, the welding region is thickened by the second electroforming layer 202, so as to avoid a case that the welding region 2 being too thin which causes burn through in welding of the frame, and thus enhancing the welding firmness of the welding region 2. Herein, the first electroforming layer 201 and the second electroforming layer 202 are combined to form the thickened portion 21.

In an exemplary embodiment, a thickness of the first electroforming layer 201 may be 5 to 30 μm, and a thickness of the second electroforming layer 202 may be 2 to 30 μm.

In some embodiments, the thickened portion may include two or more of stacked electroforming layers, for example, the thickened portion may include three, four or five electroforming layers, which is not repeatedly described herein.

In an exemplary embodiment, the first electroforming layer 201 and the display region 1 are made of a same material by a same electroforming process. A first electroforming thin film is formed by a first electroforming process, then a second electroforming thin film is formed on the first electroforming layer 201 in the welding region by a second electroforming process, and finally, the first electroforming thin film forms the display region 1 and the first electroforming layer 201 respectively, and the second electroforming thin film forms the second electroforming layer 202.

Figure 19:
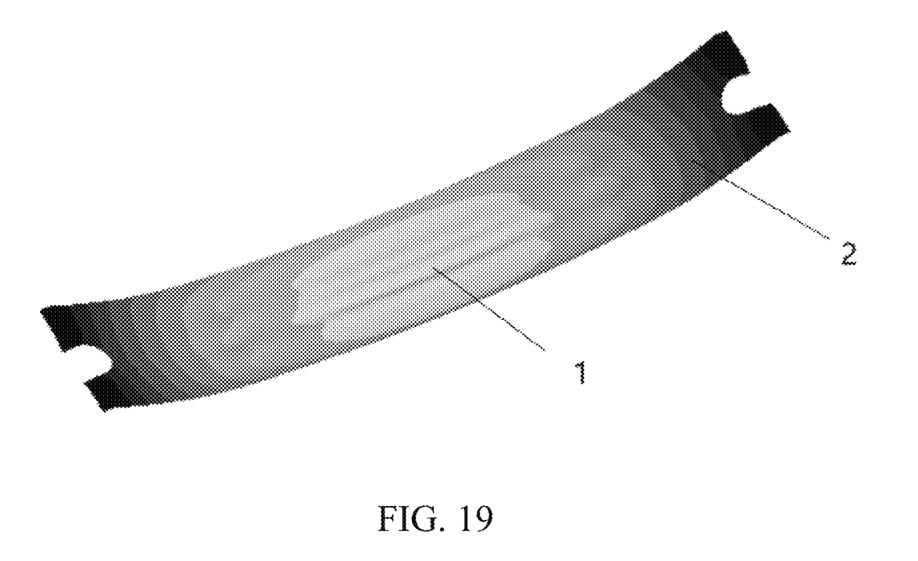
FIG. 19 is a schematic diagram of a simulation of netting wrinkles of a mask according to an exemplary embodiment of the present disclosure.

As shown in FIG. 3, in a process of netting and welding the mask, wrinkles 20 are easily generated in the welding region 2 due to a difference in thickness and a difference in shrinkage in a non-stretching direction between the welding region 2 and the display region 1, and the wrinkles 20 will be transmitted to pixel openings in the display region 1, as shown in FIG. 19. Netting wrinkles will lead to a decrease of the positional accuracy of pixel evaporation and an increase of evaporation shadow, and even lead to a risk of color mixing.

Figure 4:
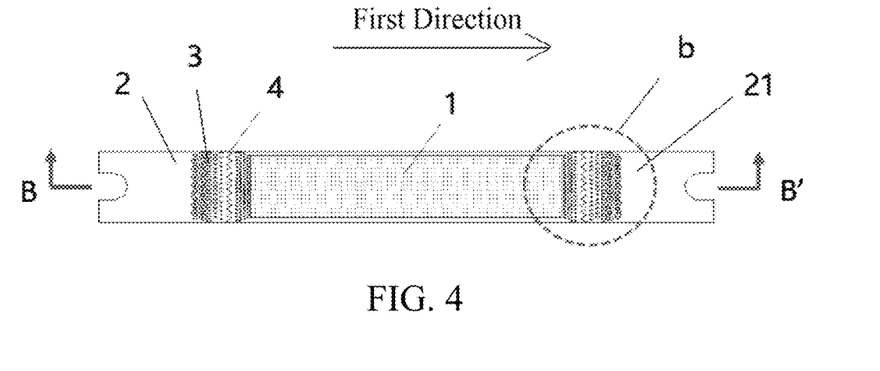
FIG. 4 is a schematic diagram of a structure of a mask according to an exemplary embodiment of the present disclosure.
Figure 5:
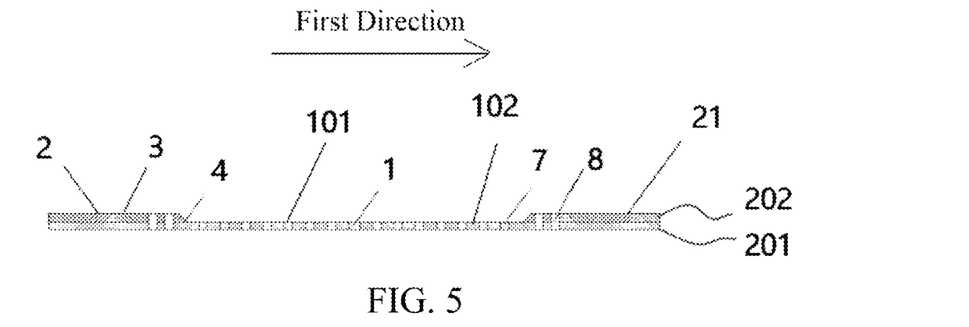
FIG. 5 is a sectional view taken along B-B' direction in FIG. 4.
Figure 6:
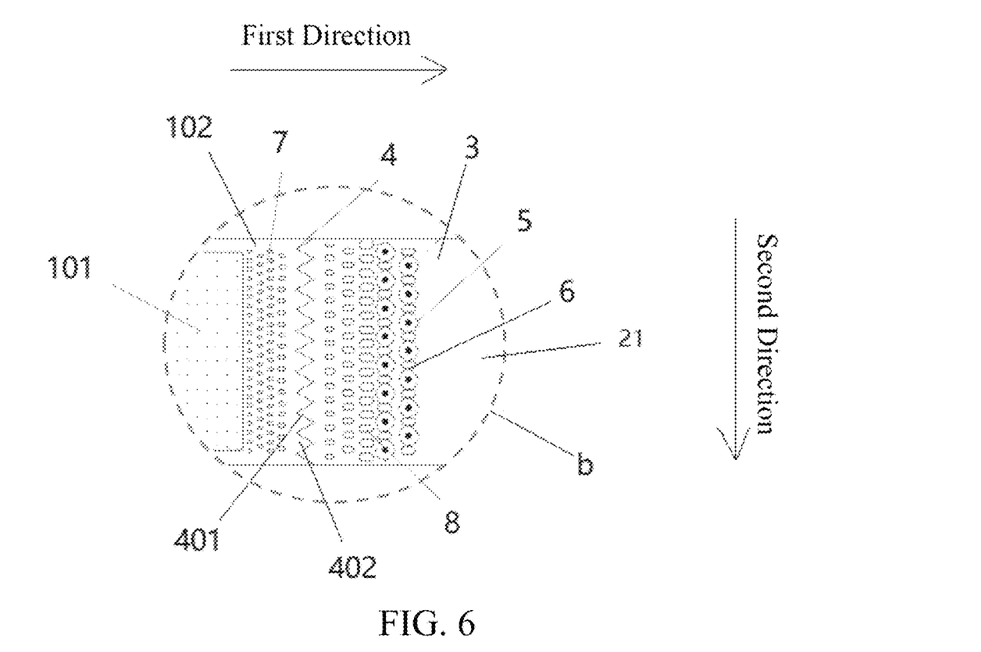
FIG. 6 is an enlarged view of b in FIG. 4.

FIG. 4 is a schematic diagram of a structure of a mask according to an exemplary embodiment of the present disclosure. FIG. 5 is a sectional view taken along a B-B' direction in FIG. 4. FIG. 6 is an enlarged view of b in FIG. 4. As shown in FIG. 4, FIG. 5 and FIG. 6, in the mask of the exemplary embodiment of the present disclosure, in a horizontal direction of the display region 1, a part of the thickened portion 21 protruding from a surface of the display region 1 includes a first welding surface 3 parallel to the surface of the display region 1 and a second welding surface 4 located on a side of the first welding surface 3 close to the display region 1. The second welding surface 4 includes multiple convex portions 401 and concave portions 402 which are disposed at intervals. The convex portions 401 and the concave portions 402 make the second welding surface 4 wave-shaped, which may effectively average a stress distribution of the mask in a process of netting, reduce a risk of wrinkling in the welding region 2, and further decrease a risk of cold solder joint in the welding region 2 and avoid a risk of lowering the accuracy of netting.

In an exemplary embodiment, the thickened portion 21 is connected to the display region 1. The second welding surface 4 connects the first welding surface 3 to the display region 1, that is, an end of the second welding surface 4 is connected to the second welding surface 4, and the other end of the second welding surface 4 is connected to the display region 1. The second welding surface 4 forms a thickness boundary between the thickened portion 21 and the display region 1. Herein, an internal angle formed between the second welding surface 4 and the surface of the display region 1 is greater than 90 degrees and less than 180 degrees, that is, the second welding surface 4 and the display region 1 are disposed obliquely and form an obtuse angle, so as to avoid wrinkles generated in the welding process of the welding region 2 from affecting pixel openings in the display region 1.

In some embodiments, the welding region may include a thickened portion and a transition portion connecting the thickened portion to the display region, and the second welding surface connects the first welding surface to the transition portion of the welding region.

Figure 7:
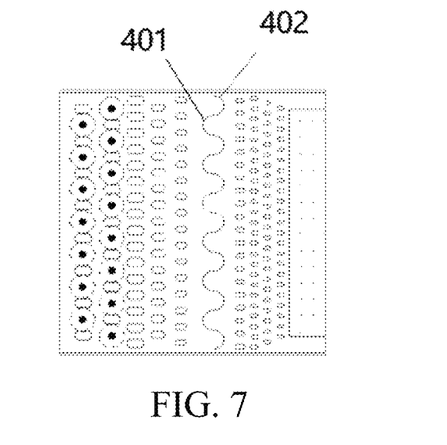
FIG. 7 is a first schematic diagram of a structure of a second welding surface in an exemplary embodiment of the present disclosure.
Figure 8:
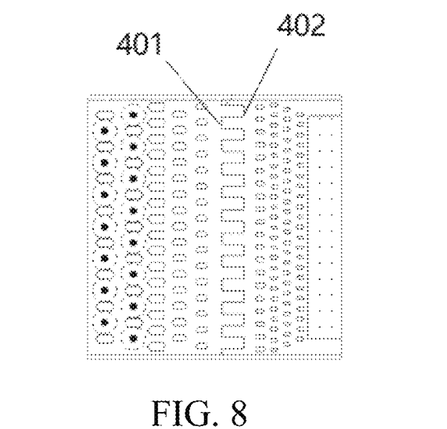
FIG. 8 is a second schematic diagram of a structure of a second welding surface in an exemplary embodiment of the present disclosure.
Figure 9:
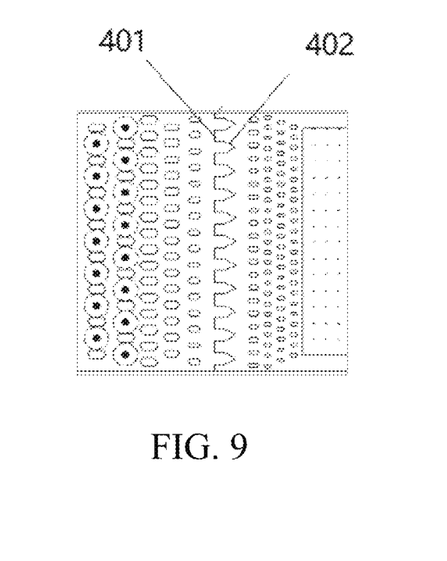
FIG. 9 is a third schematic diagram of a structure of a second welding surface in an exemplary embodiment of the present disclosure.
Figure 10:
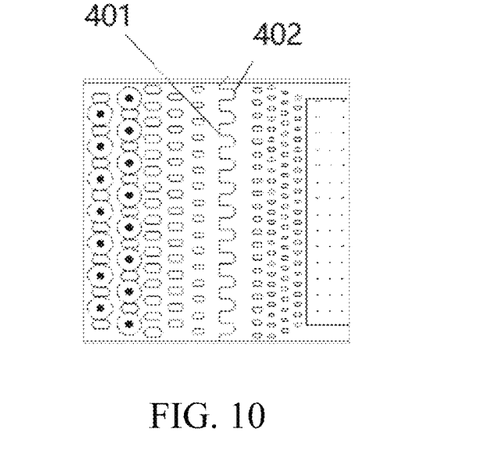
FIG. 10 is a fourth schematic diagram of a structure of a second welding surface in an exemplary embodiment of the present disclosure.

FIG. 7 is a first schematic diagram of a structure of a second welding surface in an exemplary embodiment of the present disclosure. FIG. 8 is a second schematic diagram of a structure of the second welding surface in an exemplary embodiment of the present disclosure. FIG. 9 is a third schematic diagram of a structure of the second welding surface in an exemplary embodiment of the present disclosure. FIG. 10 is a fourth schematic diagram of a structure of the second welding surface in an exemplary embodiment of the present disclosure. In an exemplary embodiment, the convex portions 401 and/or the concave portions 402 may have various shapes. For example, both the convex portions 401 and the concave portions 402 have sharp corners, and a bending direction of the convex portions 401 and a bending direction of the concave portions 402 are opposite, as shown in FIG. 6. Alternatively, the convex portions 401 and the concave portions 402 are both semi-circular, and the bending direction of the convex portions 401 and the bending direction of the concave portions 402 are opposite, as shown in FIG. 7. Alternatively, the convex portions 401 and the concave portions 402 are both U-shaped, and the bending direction of the convex portions 401 and the bending direction of the concave portions 402 are opposite, as shown in FIG. 8. Alternatively, a convex portion 401 includes a first bent side and a second bent side which are oppositely disposed, and a straight side connecting the first bent side to the second bent side. A concave portion 402 includes a first straight side and a second straight side which are oppositely disposed, and a V-shaped side connecting the first straight side to the second straight side, as shown in FIG. 9. Alternatively, a convex portion 401 includes a first bent side and a second bent side which are oppositely disposed, and a straight side connecting the first bent side to the second bent side. A concave portion 402 includes a first straight side and a second straight side which are oppositely disposed, and an arc side connecting the first straight side to the second straight side, as shown in FIG. 10.

As shown in FIG. 6, the first welding surface 3 is provided with a set welding region 5. The set welding region 5 is a region where the thickened portion 21 is welded to the frame. A welding spot required for welding in the welding region 2 is located in the set welding region 5. The set welding region 5 may have various shapes, for example, the set welding region may have regular such as circle, rectangle, rhombus, or irregular shapes.

In an exemplary embodiment, the set welding region 5 is circular, and the welding spot required for welding in the welding region 2 is circular, an area of the welding region 5 is 10-50 times the area of the welding spot required for welding in the welding region, so that enough space is reserved for the welding spot in the welding region 2, thus avoiding the diffusion of the welding spot melting and affecting regions outside the set welding region 5.

As shown in FIG. 6, the set welding regions 5 are disposed along a second direction of the thickened portion 21 to form a set welding region column, and the set welding regions 5 in adjacent set welding region columns are disposed in a staggered manner, so as to avoid mutual influence between the set welding regions 5 in adjacent set welding region columns during welding. Herein, the first direction is different from the second direction. The second direction may be a width direction of the display region.

As shown in FIG. 6, first anti-wrinkling openings 6 are disposed between adjacent set welding regions 5 in the set welding region column, and the first anti-wrinkling opening 6 are used for reducing warpage or shrinkage deformation generated in a process of melting and forming of welding spot metal when the set welding regions 5 are welded.

In an exemplary embodiment, the first anti-wrinkling openings may have various shapes, for example, the first anti-wrinkling openings may have regular shapes such as circle, rectangle, rhombus, ellipse, or irregular shapes.

As shown in FIG. 6, the set welding regions are circular, and an edge of a first anti-wrinkling opening close to a set welding region has a same curvature as an edge of the set welding region close to the first anti-wrinkling opening, so as to reduce the warpage or shrinkage deformation generated in the process of melting and forming of welding spot metal when the set welding region is welded.

As shown in FIG. 6, the display region 1 includes a pixel opening region 101 and a transition region 102. The transition region 102 is located at one side of the pixel opening region 101 close to the welding region 2, and the transition region 102 is provided with second anti-wrinkling openings 7, which are used to prevent wrinkles generated during welding in the welding region 2 from being transmitted to the pixel opening region 101 and affecting the opening accuracy of the pixel opening region.

As shown in FIG. 6, the transition region 102 is provided with multiple second anti-wrinkling openings 7, and sizes, shapes and/or density of the second anti-wrinkling openings 7 are same as those of the pixel openings in the pixel opening region 101.

In some embodiments, sizes, shapes and/or density of the second anti-wrinkling openings may be different from those of the pixel openings in the pixel opening region.

As shown in FIG. 6, the display region 1 is connected to the thickened portion 21, and the transition region 102 connects the pixel opening region 101 to the second welding surface 4, that is, one end of the transition region 102 is connected to the pixel opening region 101, and the other end of the transition region 102 is connected to the second welding surface 4.

As shown in FIG. 6, the first welding surface 3 is provided with third anti-wrinkling openings 8, wherein the third anti-wrinkling openings 8 are located on a side of the first welding surface 3 close to the second welding surface 4. The third anti-wrinkling openings 8 are used to prevent wrinkles generated during welding in the welding region 2 from being transmitted to the pixel opening region 101, which affects the opening accuracy of the pixel opening region.

In an exemplary embodiment, sizes of the third anti-wrinkling openings 8 in a third anti-wrinkling opening row gradually decrease along a direction approaching the display region 1; and/or a distance between adjacent third anti-wrinkling openings 8 in the third anti-wrinkling opening row gradually decreases along the direction approaching the display region 1, so as to prevent wrinkles generated during welding in the welding region 2 from affecting the opening accuracy of the pixel opening region.

In some embodiments, sizes, shapes and/or density of the third anti-wrinkling openings are same as those of the pixel openings in the pixel opening region.

Figure 11:
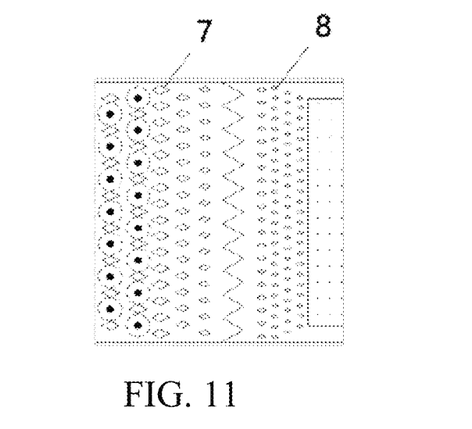
FIG. 11 is a first schematic diagram of a structure of a second anti-wrinkling opening and a third anti-wrinkling opening in an exemplary embodiment of the present disclosure.
Figure 12:
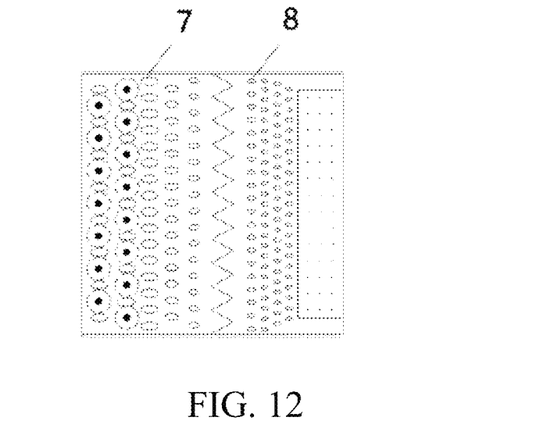
FIG. 12 is a second schematic diagram of a structure of a second anti-wrinkling opening and a third anti-wrinkling opening in an exemplary embodiment of the present disclosure.
Figure 13:
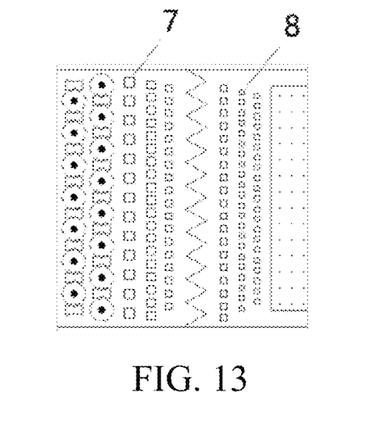
FIG. 13 is a third schematic diagram of a structure of a second anti-wrinkling opening and a third anti-wrinkling opening in an exemplary embodiment of the present disclosure.

FIG. 11 is a first schematic diagram of a structure of second anti-wrinkling openings and third anti-wrinkling openings in an exemplary embodiment of the present disclosure. FIG. 12 is a second schematic diagram of a structure of the second anti-wrinkling openings and the third anti-wrinkling openings in an exemplary embodiment of the present disclosure. FIG. 13 is a third schematic diagram of a structure of the second anti-wrinkling openings and the third anti-wrinkling openings in an exemplary embodiment of the present disclosure. In an exemplary embodiment, the second anti-wrinkling openings 7 and the third anti-wrinkling openings 8 may have various shapes. For example, the second anti-wrinkling openings 7 and the third anti-wrinkling openings 8 are rhombic, as shown in FIG. 11. Or, the second anti-wrinkling opening 7 and the third anti-wrinkling opening 8 are elliptical, as shown in FIG. 12. Or, the second anti-wrinkling openings 7 and the third anti-wrinkling openings 8 are rectangular, as shown in FIG. 13.

Figure 14:
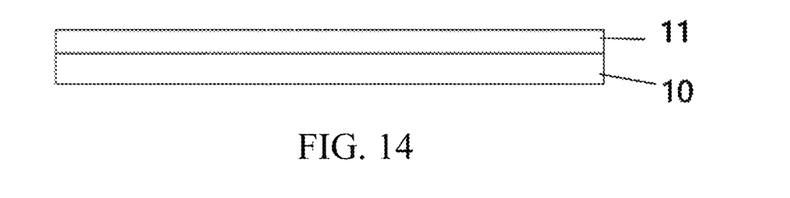
FIG. 14 is a schematic diagram after a first photoresist is formed in an exemplary embodiment of the present disclosure.

FIGS. 14 to 18 are schematic diagrams showing a manufacturing process of a mask according to an exemplary embodiment of the present disclosure. A method for manufacturing the mask according to the exemplary embodiment of the present disclosure includes the following steps:

(1) Selecting a Steel Use Stainless (SUS) substrate or highly doped monocrystalline silicon as a conductive substrate 10, and coating a first photoresist 11 on a surface of a side of the conductive substrate 10, as shown in FIG. 14.

Figure 15:
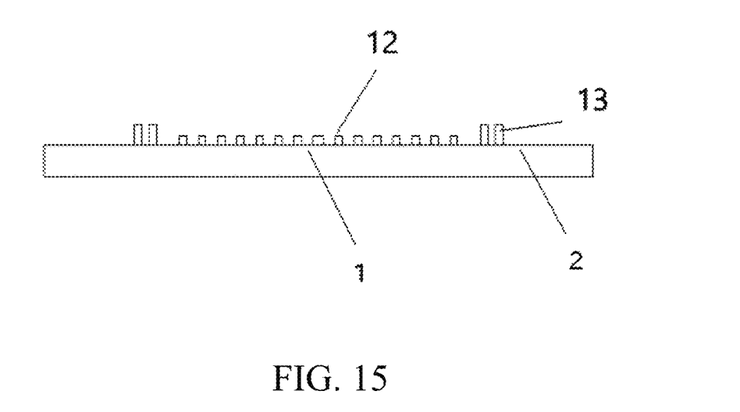
FIG. 15 is a schematic diagram after a first photoresist portion and a second photoresist portion are formed in an exemplary embodiment of the present disclosure.

(2) After exposure and development, leaving a photoresist portion at positions of the conductive substrate 10 where openings are required. Herein, first photoresist portions 12 are left in the display region 1 and second photoresist portions 13 are left in the welding region 2. Furthermore, by adjusting the exposure amount and intensity, height of the photoresist portion is adjusted so that height of the second photoresist portion 13 is greater than that of the first photoresist portion 12, as shown in FIG. 15.

Figure 16:
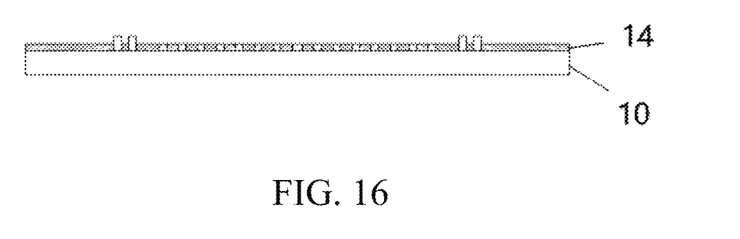
FIG. 16 is a schematic diagram after a first electroforming thin film is formed in an exemplary embodiment of the present disclosure.

(3) Disposing the conductive substrate 10 with the above structure in an electroforming solution, taking the conductive substrate 10 as an electroforming cathode and an electroforming material as an electroforming anode, and electrifying and electroforming the conductive substrate 10 at a certain temperature and current density, to make an electroforming material form a first electroforming thin film 14 on the conductive substrate 10, as shown in FIG. 16. Herein, the electroforming material may be iron, nickel, cobalt, etc.

Figure 17:
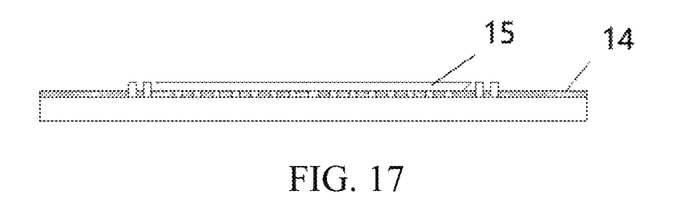
FIG. 17 is a schematic diagram after a second photoresist is formed in an exemplary embodiment of the present disclosure.

(4) Coating a second photoresist thin film on a surface of the first electroforming film 14, exposing and developing the second photoresist thin film, and forming a second photoresist 15 from the second photoresist film by adjusting the exposure amount and exposure intensity. Herein, a cross section of the second photoresist 15 is inverted trapezoidal, and an external angle formed by the second photoresist 15 between opposite sides of a surface of the conductive substrate 10 in a horizontal direction and a surface of the first electroforming film 14 on a side away from the conductive substrate 10 may be 110-135 degrees, as shown in FIG. 17.

Figure 18:
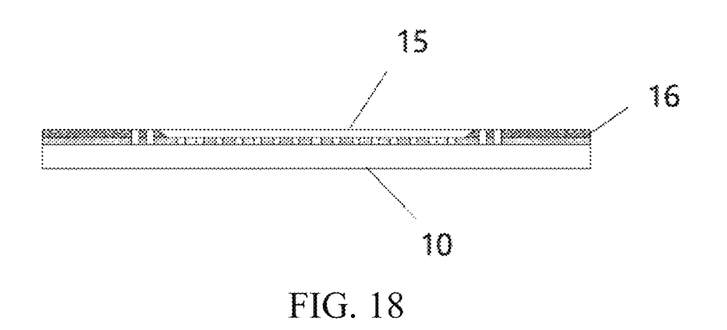
FIG. 18 is a schematic diagram after a second electroforming thin film is formed in an exemplary embodiment of the present disclosure.

(5) Disposing the conductive substrate 10 with the above structure in an electroforming solution, taking the conductive substrate 10 as an electroforming cathode and an electroforming material as an electroforming anode, and electrifying and electroforming the conductive substrate 10 at a certain temperature and current density, to form a second electroforming thin film 16 on the first electroforming thin film 14. Herein, the cross section of the second electroforming thin film 16 is a regular trapezoid, which is complementary to the inverted trapezoid cross section of the second photoresist 15. An external angle formed between opposite sides of the second electroforming thin film 16 of the surface of the conductive substrate 10 in the horizontal direction and the surface of the first electroforming thin film 14 on a side away from the conductive substrate 10 may be 45-70 degrees. A surface of the second electroforming thin film 16 away from the conductive substrate 10 is flush with a surface of the second photoresist 15 away from the conductive substrate 10, as shown in FIG. 18.

(6) Taking out the conductive substrate 10 with the above structure from the electroforming solution, and after cleaning, removing the first photoresist portions 12 to form pixel openings in the display region 1; removing the second photoresist portions 13 to form first anti-wrinkling openings, second anti-wrinkling openings and third anti-wrinkling openings in the welding region 2, making the first electroforming thin film form a first electroforming layer and the second electroforming thin film form a second electroforming layer. Finally, separating the first electroforming layer and the second electroforming layer from the conductive substrate to form a mask, as shown in FIG. 5.

The present disclosure provides a mask assembly, which includes a frame and the aforementioned mask, wherein a welding region of the mask is connected to the frame by welding.

The present invention provides a method for manufacturing a mask, which includes the following steps:
    forming a display region, and welding regions on two opposite sides of the display region in a first direction, wherein the welding regions at least include thickened portions, and set welding regions are disposed on the thickened portions; a thickness of a set welding region is greater than that of the display region; and in a horizontal direction of the display region, the thickened portions protrude from a surface of at least one side of the display region.

Although the implementation modes of the present disclosure are disclosed above, the contents are only implementation modes adopted to easily understand the present disclosure and not intended to limit the present disclosure. Any person skilled in the art may make any modifications and variations in forms and details of implementations without departing from the spirit and the scope disclosed in the present disclosure, but the patent protection scope of the present application should still be subject to the scope defined by the appended claims.

What is claimed is:

1. A mask, comprising a display region and welding regions located on opposite sides of the display region in a first direction, wherein each welding region at least comprises a thickened portion, and a set welding region is disposed on the thickened portion; a thickness of the set welding region is greater than a thickness of the display region; and in a horizontal direction of the display region, the thickened portion protrudes from a surface of at least one side of the display region, wherein a plurality of set welding regions are disposed along a second direction of the thickened portion to form a set welding region column, and the plurality of set welding regions in adjacent set welding region columns are disposed in a staggered manner, and the first direction is different from the second direction, wherein a first anti-wrinkling opening is formed between two adjacent set welding regions in the set welding region column.

2. The mask according to claim 1, wherein in the horizontal direction of the display region, a part of the thickened portion protruding from the surface of the display region comprises a first welding surface parallel to the surface of the display region and a second welding surface connected to a side of the first welding surface close to the display region, and the second welding surface comprises a plurality of convex portions and concave portions disposed at intervals.

3. The mask according to claim 2, wherein the convex portions and/or the concave portions are pointed, semicircular arc or U-shaped.

4. The mask according to claim 2, wherein an internal angle formed between the second welding surface and the surface of the display region is greater than 90 degrees and less than 180 degrees.

5. The mask according to claim 1, wherein an area of the set welding region is 10-50 times an area of a welding spot required for welding in the welding region.

6. The mask according to claim 1, wherein curvature of an edge of the first anti-wrinkling opening close to the set welding region is same as curvature of an edge of the set welding region close to the first anti-wrinkling opening.

7. The mask according to claim 1, wherein the display region comprises a pixel opening region and a transition region, wherein the transition region is located at one side of the pixel opening region close to the welding region, and the transition region is provided with second anti-wrinkling openings.

8. The mask according to claim 7, wherein the pixel opening region is provided with pixel openings and the second anti-wrinkling openings are the same as the pixel openings.

9. The mask according to claim 7, wherein the thickened portion is provided with third anti-wrinkling openings and the third anti-wrinkling openings are located at one side of the thickened portion close to the display region.

10. The mask according to claim 9, wherein the thickened portion is provided with a plurality of third anti-wrinkling openings, and the third anti-wrinkling openings are disposed along the first direction of the display region to form a third anti-wrinkling opening row.

11. The mask according to claim 10, wherein sizes of the third anti-wrinkling openings in the third anti-wrinkling opening row gradually decrease along a direction approaching the display region; and/or distances between adjacent third anti-wrinkling openings in the third anti-wrinkling opening row gradually decrease along the direction approaching the display region.

12. The mask according to claim 1, wherein in a thickness direction of the thickened portion, the thickened portion comprises a first electroforming layer and a second electroforming layer which are stacked, and the second electroforming layer at least partially protrudes from the display region.

13. The mask according to claim 12, wherein a thickness of the first electroforming layer is 5 to 30 μm, and a thickness of the second electroforming layer is 2 to 30 μm.

14. A mask assembly, comprising a frame and the mask according to claim 1, wherein a welding region of the mask is connected to the frame by welding.

15. A method for manufacturing the mask according to claim 1, comprising:

forming the display region, and the welding regions on two opposite sides of the display region in the first direction.

* * * * *